United States Patent [19]

Arai et al.

[11] Patent Number: 4,870,684
[45] Date of Patent: Sep. 26, 1989

[54] PLL CIRCUIT FOR GENERATING OUTPUT SIGNAL SYNCHRONIZED WITH INPUT SIGNAL BY SWITCHING FREQUENCY DIVIDING RATIO

[75] Inventors: Masashi Arai; Ryuichi Ogawa, both of Gunma, Japan

[73] Assignee: Sanyo Electric Co., Ltd., Japan

[21] Appl. No.: 271,883

[22] Filed: Nov. 15, 1988

[30] Foreign Application Priority Data

Nov. 16, 1987 [JP] Japan .............................. 62-288822
Nov. 19, 1987 [JP] Japan .............................. 62-292430

[51] Int. Cl.$^4$ ............................................ H04H 5/00
[52] U.S. Cl. ...................................... 381/7; 329/316; 329/325; 331/25
[58] Field of Search ................................ 381/4, 7, 2, 3; 329/124; 358/144; 331/20, 25

[56] References Cited

U.S. PATENT DOCUMENTS

| 4,047,116 | 9/1977 | Ogita | 329/124 |
| 4,611,226 | 9/1986 | Buhse et al. | 358/144 |
| 4,739,284 | 4/1988 | McGinn | 329/124 |
| 4,817,150 | 3/1989 | Filliman | 381/7 |

Primary Examiner—Forester W. Isen
Attorney, Agent, or Firm—Darby & Darby

[57] ABSTRACT

A PLL circuit comprises a variable frequency divider (7) for frequency-dividing a signal having a reference frequency $f_1$ with a frequency dividing ratio $n_1$ or $n_2$, a fixed frequency divider (8) for further frequency-dividing an output of the variable frequency divider with a frequency dividing ratio $n_0$, to generate a first output signal and a second output signal which is out of phase by 90° from the first output signal, multiplier (10) for multiplying an input signal by the second output signal, a comparator (11) for comparing an output of the multiplier with a predetermined reference voltage, and a D-type flip-flop (12) receiving as a D input an output of the comparator and receiving as a clock input the first output signal, an output of the D-type flip-flop (12) being applied to the variable frequency divider (7). When the second output signal leads the input signal by 90° or more, the output of the D-type flip-flop (12) attains an "L" level, so that the large frequency dividing ratio $n_2$ is selected. On the other hand, when the second output signal lags the input signal by 90° or more, the output of the D-type flip-flop (12) attains an "H" level, so that the small frequency dividing ratio $n_1$ is selected.

9 Claims, 6 Drawing Sheets

PLL CIRCUIT FOR GENERATING OUTPUT SIGNAL SYNCHRONIZED WITH INPUT SIGNAL BY SWITCHING FREQUENCY DIVIDING RATIO

BACKGROUND OF THE INVENTION

1. Field of the Invention

The present invention relates generally to PLL (Phase Locked Loop) circuits, and more particularly, to a PLL circuit for generating an output signal synchronized with an input signal, which is used for demodulation in, for example, a stereo receiver.

2. Background Art

Conventionally, as techniques for generating an output signal synchronized with an input signal, a PLL circuit has been generally used. Such a PLL circuit has been widely used as a stereo demodulator in, for example, a stereo receiver.

FIG. 1 is a schematic block diagram showing one example of such a conventional PLL circuit. In FIG. 1, the PLL circuit comprises an input terminal 1, a phase comparator 2, a low-pass filter (LPF) 3, a voltage controlled oscillator (VCO) 4, and an output terminal 5. In the PLL circuit shown in FIG. 1, the phases of an input signal inputted to the input terminal 1 and an output signal of the VCO 4 are compared with each other in the phase comparator 2. As a result, the phase comparator 2 outputs an error signal. This error signal is applied to the VCO 4 through the low-pass filter 3. An oscillating frequency of the VCO 4 is controlled by an output of this low-pass filter 3. An output of the VCO 4 is extracted through the output terminal 5. Such a conventional PLL circuit is disclosed in, for example, Japanese Patent Laying-Open Gazette No. 7635/1982.

However, in the conventional PLL circuit shown in FIG. 1, the low-pass filter 3 is indispensable in order to remove an unnecessary component included in the output signal of the phase comparator 2 and apply to the VCO 4 only an error signal corresponding to the phase difference between the input signal and the output signal of the VCO 4. Therefore, if and when the above described PLL circuit is achieved as an integrated circuit (IC), a capacitor (not shown) constituting the low-pass filter 3 must be externally connected to the IC, so that the number of parts to be externally connected and the number of pins used for external connection are increased. Thus, integration is not improved and the manufacturing process is complicated, so that the cost is increased.

SUMMARY OF THE INVENTION

Therefore, an object of the present invention is to provide a PLL circuit suitable for formation as an integrated circuit.

Another object of the present invention is to provide a PLL circuit including no low-pass filter.

Still another object of the present invention is to provide a PLL circuit having very high control precision.

A further object of the present invention is to provide a PLL circuit capable of increasing the capture speed and ensuring stability at the time of phase lock.

A still further object of the present invention is to provide a stereo receiver suitable for formation as an integrated circuit.

Briefly stated, the present invention is directed to a PLL circuit comprising an input terminal receiving an input signal from the exterior, an oscillator for generating a signal having a predetermined reference frequency, a variable frequency divider for frequency-dividing the signal having the reference frequency with a variable frequency dividing ratio, a fixed frequency divider for frequency-dividing an output of the variable frequency divider to generate a first output signal and a second output signal which is out of phase by 90° from the first output signal, a first multiplier for multiplying the input signal by the second output signal, a comparator for comparing an output of the first multiplier with a predetermined reference voltage, and a D-type flip-flop receiving as a D input an output of the comparator and receiving as a clock input the first output signal from the fixed frequency divider, the frequency dividing ratio of the variable frequency divider being changed depending on an output of the D-type flip-flop.

In accordance with another aspect of the present invention, the PLL circuit further comprises a second multiplier for multiplying the input signal by the first output signal and a synchronization detecting circuit receiving an output of the second multiplier for detecting synchronization of the input signal with the first output signal. The variable frequency divider is responsive to an output of the synchronization detecting circuit for changing the frequency dividing ratio in a first range when the input signal is not synchronized with the first output signal, while changing the frequency dividing ratio in a second range narrower than the first range when the input signal is synchronized with the first output signal.

In accordance with still another aspect of the present invention, the stereo receiver comprises a circuit for receiving a stereo signal, a detector for detecting the received stereo signal, a demodulator for stereo demodulating the detected stereo signal, and a PLL circuit for detecting a particular signal in the detected stereo signal to generate a signal synchronized with this signal. The PLL circuit comprises an input terminal receiving an input signal from the detector, an oscillator for generating a signal having a predetermined reference frequency, a variable frequency divider for frequency-dividing the signal having the reference frequency with a variable frequency dividing ratio, a fixed frequency divider for frequency-dividing an output of the variable frequency divider to generate a first output signal and a second output signal which is out of phase by 90° from the first output signal, a first multiplier for multiplying the input signal by the second output signal, a comparator for comparing an output of the first multiplier with a predetermined reference voltage, and a D-type flip-flop receiving as a D input an output of the comparator and receiving as a clock input the first output signal from the fixed frequency divider, the frequency dividing ratio of the variable frequency divider being changed depending on an output of the D-type flip-flop.

A principal advantage of the present invention is that the frequency dividing ratio of the variable frequency divider is controlled by the output signal of the D-type flip-flop, so that the PLL circuit can be structured without using a low-pass filter, whereby the number of parts externally connected such as a capacitor and the number of pins used for external connection can be reduced.

Another advantage of the present invention is that the output of the fixed frequency divider is used as a clock signal of the D-type flip-flop, so that switching of the frequency dividing ratio of the variable frequency divider can be controlled in the same cycle as that in a phase comparing operation, whereby good control precision of the PLL circuit can be ensured.

Still another advantage of the present invention is that the capture range of the PLL circuit is changed based on the output signal of the synchronization detecting circuit, whereby the capture range is made wide at the capture time so that the capture time can be shortened while the capture range is made narrow at the time of phase lock so that the stability can be enhanced.

A further advantage of the present invention is that the stereo receiver can be more easily formed as an integrated circuit.

A still further advantage of the present invention is that a stereo demodulating operation of the stereo receiver can be performed with higher precision.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
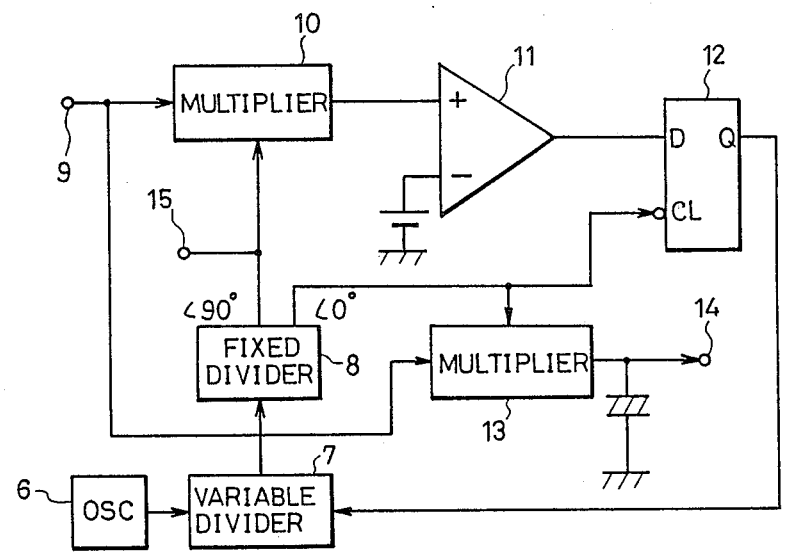
FIG. 2 is a schematic block diagram showing a PLL circuit according to a first embodiment of the present invention.

FIG. 2 is a schematic block diagram showing a PLL circuit according to a first embodiment of the present invention.

Description is now made on a structure of the PLL circuit shown in FIG. 2. In FIG. 2, an oscillator 6 generates a reference signal having a predetermined frequency $f_1$, to apply the same to a variable frequency divider 7. The variable frequency divider 7 frequency-divides an output signal of the oscillator 6 into $1/n_1$ or $1/n_2$, an output thereof being applied to a fixed frequency divider 8. This fixed frequency divider 8 further frequency-divides the output signal of the variable frequency divider 7 into $1/n_0$, to generate a first output signal and a second output signal which is out of phase by 90° from this first output signal. On the other hand, an input signal applied to an input terminal 9 is applied to a first multiplier 10. This first multiplier 10 multiplies the input signal from the input terminal 9 by the second output signal from the fixed frequency divider 8. An output of the first multiplier 10 is applied to a positive input of a comparator 11. The comparator 11 has its negative input receiving a reference voltage Vref. An output of the comparator 11 is applied to a D input terminal of a D-type flip-flop 12. In addition, the D-type flip-flop 12 has its clock input terminal receiving a first output signal from the above described fixed frequency divider 8. Furthermore, a Q output signal of the D-type flip-flop 12 is applied to the variable frequency divider 7 as an output control signal. In addition, there is provided a second multiplier 13 for multiplying the input signal inputted through the input terminal 9 by the first output signal outputted from the fixed frequency divider 8, to synchronously detect the above described input signal. An output of this multiplier 13 is extracted through an output terminal 14. Additionally, the second output signal from the fixed frequency divider 8 can be extracted through an output terminal 15.

Figure 1:
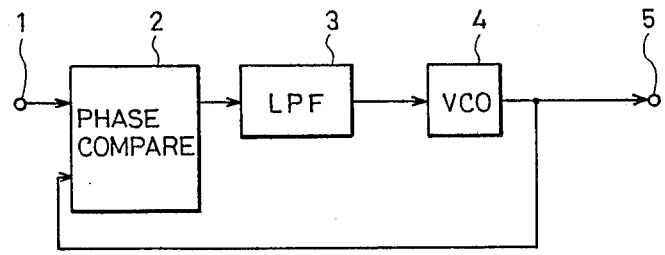
FIG. 1 is a schematic block diagram showing one example of a conventional PLL circuit.
Figure 3:
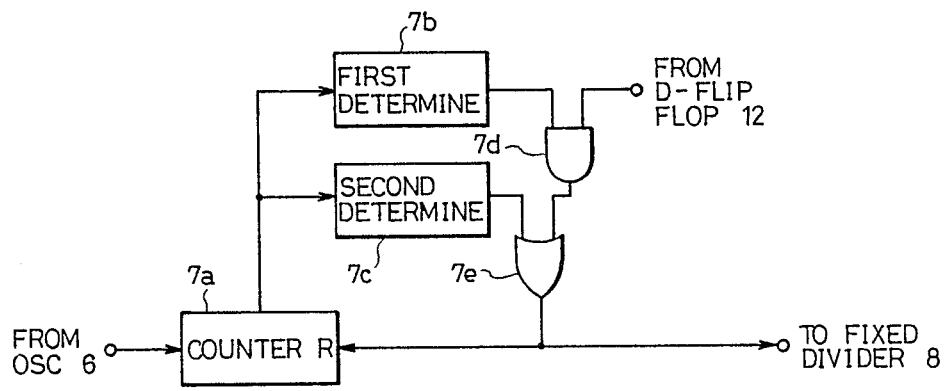
FIG. 3 is a block diagram showing specifically a variable frequency divider shown in FIG. 2.

FIG. 3 is a block diagram showing specifically the variable frequency divider 7 shown in FIG. 2. In FIG. 3, a counter 7a counts an output signal having a frequency $f_1$ from the oscillator 6 (in FIG. 2), the counted value being applied to first and second determining circuits 7b and 7c. An output of the first determining circuit 7b is applied to one input of an AND gate 7d. On the other hand, the AND gate 7d has another input receiving the output control signal from the D-type flip-flop 12. In addition, an output of the second determining circuit 7c is applied to one input of an OR gate 7e. The OR gate 7e has another input receiving an output signal of the AND gate 7d. An output of the OR gate 7e is applied to a reset terminal of the counter 7a, and provided as an output signal of the variable frequency divider 7, to be applied to the fixed frequency divider 8.

Description is now made on an operation of the variable frequency divider 7 shown in FIG. 3. Consider a case in which the output control signal applied to the input of the AND gate 7d from the D-type flip-flop 12 is at an "H" level. In this case, when the counted value of the counter 7a reaches $n_1$, an "H" level output signal is generated from the first determining circuit 7b, so that an "H" level output signal is generated from the AND gate 7d. This "H" level output signal is applied to the reset terminal of the counter 7a through the OR gate 7e, so that the counter 7a is reset. More specifically, when the "H" level output control signal is generated from the D-type flip-flop 12, a signal having a frequency of $f_1/n_1$ is generated as the output of the variable frequency divider 7.

On the other hand, consider a case in which the output control signal applied to the input of the AND gate 7d from the D-type flip-flop 12 is at an "L" level. In this case, an "H" level signal is not generated at the output of the AND gate 7d. When the counted value of the counter 7a reaches $n_2$ ($>n_1$), and "H" level output signal is generated from the second determining circuit 7c, so that an "H" level output signal is generated from the OR gate 7e. This "H" level output signal is applied to the reset terminal of the counter 7a, so that the counter 7a is reset. More specifically, when the "L" level output control signal is generated from the D-type flip-flop 12, a signal having a frequency of $f_1/n_2$ is generated as the output of the variable frequency divider 7.

As described in the foregoing, the circuit shown in FIG. 3 is operated as a variable frequency divider having two kinds of frequency dividing ratios. The frequency-divided output outputted from the OR gate 7e is further frequency-divided into $1/n_0$ by the fixed frequency divider 8 (in FIG. 2).

Figure 5:
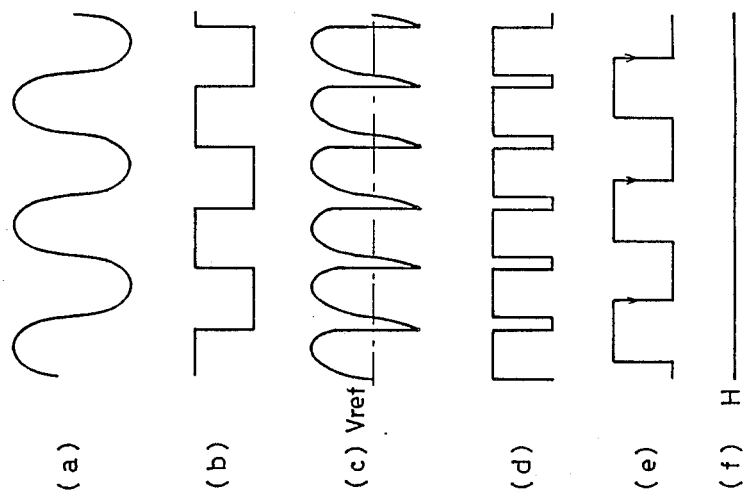
FIGS. 4 and 5 are waveform diagrams for explaining as operation according to the first embodiment shown in FIGS. 2 and 3.
Figure 4:
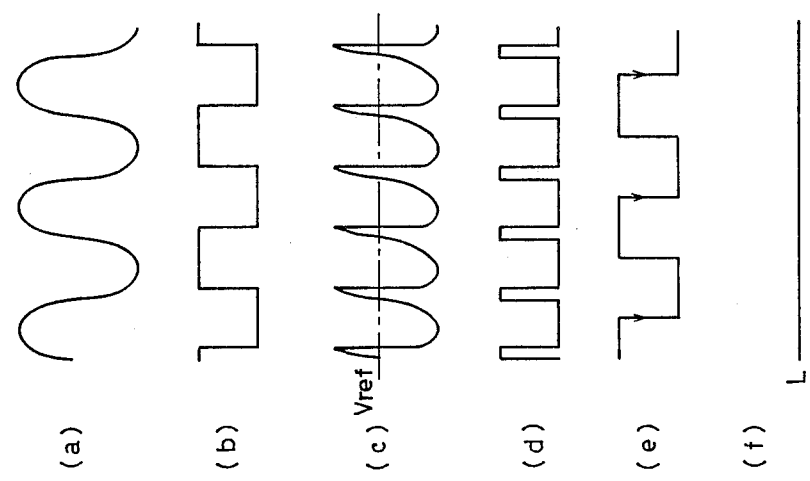

FIGS. 4 and 5 are waveform diagrams for explaining an operation according to the embodiment shown in FIGS. 2 and 3.

First, if and when the second output signal (in FIG. 4(b)) outputted from the fixed frequency divider 8 leads the input signal (in FIG. 4(a)) applied to the input terminal 9 of the PLL circuit shown in FIG. 2 by 90° or more, the output waveform of the first multiplier 10 is shown in FIG. 4(c). When the reference voltage applied to the negative input of the comparator 11 is set to a level Vref represented by a dot and dash line in FIG. 4(c), the output waveform of the comparator 11 is shown in FIG. 4(d). The signal shown in FIG. 4(d) is applied to the D input terminal of the D-type flip-flop 12 while the first output signal (in FIG. 4(e)) outputted from the fixed frequency divider 8 is applied to the clock input terminal of the D-type flip-flop 12. Since the D-type flip-flop 12 is set to an input signal level at the time of application of a clock pulse, the output signal of the D-type flip-flop 12 is always at the "L" level, as shown in FIG. 4(f). The variable frequency divider shown in FIG. 3 is controlled by this "L" level output signal from the D-type flip-flop 12. As a result, as described with reference to FIG. 3, the frequency dividing ratio of the variable frequency divider 7 becomes $n_2$, so that the signal having the frequency of $f_1/n_2$ is generated from the variable frequency divider 7.

On the other hand, if the second output signal (in FIG. 5(b)) outputted from the fixed frequency divider 8 lags the input signal (in FIG. 5(a)) applied to the input terminal 9 by 90° or more, the output waveform of the first multiplier 10 is shown in FIG. 5(c). When the reference voltage applied to the negative input of the comparator 11 is set to the level Vref represented by a dot and dash line in FIG. 5(c), the output waveform of the comparator 11 is shown in FIG. 5(d). This signal shown in FIG. 5(d) is applied to the D input terminal of the D-type flip-flop 12 while the first output signal (in FIG. 5(e)) outputted from the fixed frequency divider 8 is applied to the clock input terminal of the D-type flip-flop 12. Since the D-type flip-flop 12 is set to an input signal level at the time of application of a clock pulse, the output signal of the D-type flip-flop 12 is always at the "H" level, as shown in FIG. 5(f). The variable frequency divider 7 shown in FIG. 3 is controlled by this "H" level output signal from the D-type flip-flop 12. As a result, as described with reference to FIG. 3, the frequency dividing ratio of the variable frequency divider 7 becomes $n_1$, so that the signal having the frequency of $f_1/n_1$ is generated from the variable frequency divider 7.

As described in the foregoing, if and when the second output signal of the fixed frequency divider 8 leads the input signal (in FIG. 4(a)) of the PLL circuit by 90° or more (in FIG. 4(b)), the frequency dividing ratio of the variable frequency divider 7 becomes $n_2$ according to the "L" level output control signal of the D-type flip-flop 12, so that the output signal of the variable frequency divider 7 gradually lags. Correspondingly, the first and second output signals of the fixed frequency divider 8 also lag. As a result, the input signal is synchronized with the second output signal of the fixed frequency divider 8 with a phase difference of 90°, and the phases of the above described input signal and the first output signal of the fixed frequency divider 8 coincide with each other.

On the other hand, if the second output signal of the fixed frequency divider 8 lags the input signal (in FIG. 5(a)) of the PLL circuit by 90° or more (in FIG. 5(b)), the frequency dividing ratio of the variable frequency divider 7 becomes $n_1$ according to the "H" level output control signal of the D-type flip-flop 12, so that the output signal of the variable frequency divider 7 gradually leads. Correspondingly, the first and second output signals of the fixed frequency divider 8 also lead. As a result, the input signal is synchronized with the second output signal of the fixed frequency divider 8 with a phase reference of 90°, and the phases of the above described input signal and the first output signal of the fixed frequency divider 8 coincide with each other.

In a state in which the phase of the PLL circuit is locked, the state described with reference to FIG. 4 and the state described with reference to FIG. 5 alternately occur, so that the output signal of the D-type flip-flop 12 is inverted every one cycle of the output signal of the fixed frequency divider 8. Therefore, the variable frequency divider 7 alternately repeats $1/n_1$ frequency division and $1/n_2$ frequency division. In such a case, if the values of the frequency dividing ratios $n_1$ and $n_2$ of the variable frequency divider 7 are set to close each other, the stability of phase lock can be increased when the phase is locked. On the contrary, if the values of the frequency dividing ratios $n_1$ and $n_2$ are made greatly different from each other, the capture time of the PLL circuit can be shortened. Meanwhile, when the phase is locked in a range other than the center of the capture range of the PLL circuit, $1/n$ frequency division and $1/n_2$ frequency division are not necessarily alternately made, so that switching is performed in a given ratio.

As described in the foregoing, in a state in which the phase of the PLL circuit is locked, the phase of the input signal coincides with the phase of the first output signal of the fixed frequency divider 8. Thus, if the input signal is synchronously detected by the first output signal of the fixed frequency divider 8 using the second multiplier 13, an output signal indicating that the above described input signal exists can be generated from the output terminal 14.

Additionally, when a synchronized signal with a 90° phase difference from the input signal is required, it is necessary to extract the second output signal through the output terminal 15.

Meanwhile, the first multiplier 10 is a well-known double balanced type multiplier, which generates the output signal as shown in FIGS. 4(c) and 5(c), using two input signals obtained based on the input signal and the inverted signal thereof and two output signals obtained based on the second output signal obtained from the fixed frequency divider 8 and the inverted signal thereof.

As described in the foregoing, according to one embodiment of the present invention as shown in FIGS. 2 to 5, the PLL circuit can be structured without using a low-pass filter unlike the conventional example. Thus, if and when the PLL circuit is achieved as the IC, the number of parts to be externally connected such as a capacitor and the number of pins used for external connection can be reduced.

Additionally, according to the above described first embodiment, the first output signal of the fixed frequency divider 8 is applied to the clock input terminal of the D-type flip-flop 12, so that the switching of the frequency dividing ratio of the variable frequency divider can be controlled in the same cycle as the cycle of a phase comparing operation, whereby a high-precision PLL circuit can be obtained.

Figure 6:
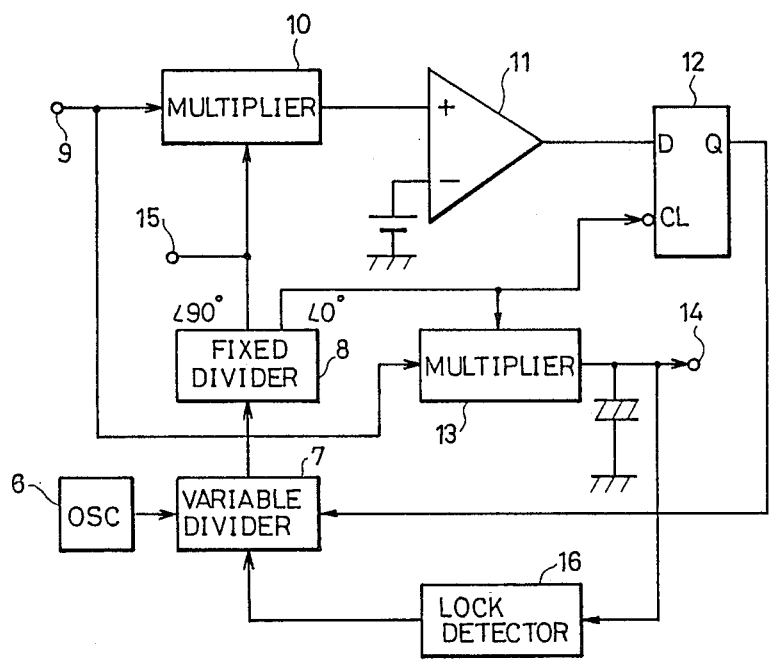
FIG. 6 is a schematic block diagram showing a PLL circuit according to a second embodiment of the present invention.

FIG. 6 is a schematic block diagram showing a PLL circuit according to a second embodiment of the present invention.

The PLL circuit shown in FIG. 6 is the same as that according to the first embodiment shown in FIG. 2 except for the following. More specifically, there is provided a lock detecting circuit 16 for detecting the state of phase lock of the PLL circuit. In addition, there is provided a variable frequency divider 17 in which the switching range of a frequency dividing ratio is changed depending on an output signal of the lock detecting circuit 16, in place of the variable frequency divider 7 shown in FIG. 2. The lock detecting circuit 16 generates an "L" level signal in a state in which the phase is not locked, that is, in a non-locked state while generating an "H" level signal in a locked state.

Figure 7:
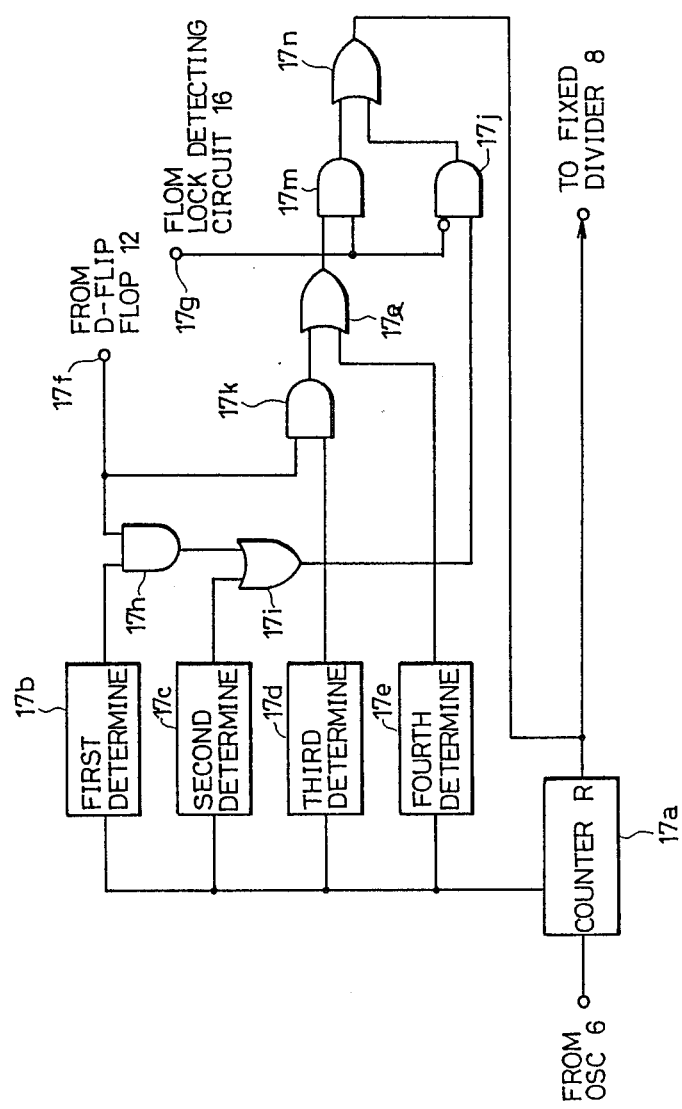
FIG. 7 is a block diagram showing specifically a variable frequency divider shown in FIG. 6.

FIG. 7 is a block diagram showing specifically the variable frequency divider 17 shown in FIG. 6. In FIG. 7, a counter 17a counts an output signal having a frequency $f_1$ of the oscillator 6 (in FIG. 6), the counted value being applied to first to fourth determining circuits 17b, 17c, 17d and 17e. In addition, the output signal of the D-type flip-flop 12 (in FIG. 6) is applied to an input terminal 17f, while the output signal of the lock detecting circuit 16 (in FIG. 6) is applied to an input terminal 17g. An output of the first determining circuit 17b is applied to one input of an AND gate 17h. The AND gate 17h has another input receiving the output control signal from the D-type flip-flop 12 through the input terminal 17f. Furthermore, an output of the second determining circuit 17c is applied to one input of an OR gate 17i. The OR gate 17i has another input receiving an output signal of the AND gate 17h. An output of the OR gate 17i is applied to one input of an AND gate 17j. In addition, the AND gate 17j has another input, i.e., its inverted input receiving a detection signal from the lock detecting circuit 16 through the input terminal 17g.

Additionally, an output of the third determining circuit 17d is applied to one input of an AND gate 17k. The AND gate 17k has another input receiving the output control signal from the D-type flip-flop 12 through the input terminal 17f. Furthermore, an output of the fourth determining circuit 17e is applied to one input of an OR gate 17l. The OR gate 17l has another input receiving an output signal of the AND gate 17k. An output of the OR gate 17l is applied to one input on an AND gate 17m. In addition, the AND gate 17m has another input receiving the detection signal from the lock detecting circuit 16 through the input terminal 17g.

Additionally, outputs of the AND gates 17j and 17m are applied to inputs of an OR gate 17n. An output of the OR gate 17n is applied to a reset terminal of the counter 17a, and provided as the output signal of the variable frequency divider 17, to be applied to the fixed frequency divider 8.

Description is now made on an operation of the variable frequency divider 17 shown in FIG. 7. First, at the time of carrying out a capturing operation by the PLL circuit, the phase has not been locked yet, so that an "L" Level detection signal is applied to the input terminal 17g from the lock detecting circuit 16. Consequently, the AND gate 17m is closed while the AND gate 17j is opened. In this state, consider a case in which the "H" level output control signal as shown in FIG. 5 (f) is applied to one input of the AND gate 17h from the D-type flip-flop 12 through the input terminal 17f. In this case, when the counted value of the counter 17a reaches $n_1$, and "H" level output signal is generated from the first determining circuit 17b, so that an "H" level output signal is generated from the AND gate 17h. This "H" level output signal is applied to a reset terminal of the counter 17a through the OR gate 17i, the AND gate 17j and the OR gate 17n, so that the counter 17a is reset. More specifically, when the "H" level output control signal is generated from the D-type flip-flop 12, a signal having a frequency of $f_1/n_1$ is generated at the output of the OR gate 17n as an output of the variable frequency divider 17.

On the other hand, consider a case in which the "L" level output control signal as shown in FIG. 4(f) is applied to one input of the AND gate 17h from the D-type flip-flop 12 through the input terminal 17f. In this case, an "H" level signal is not generated at the output of the AND gate 17h. When the counted value of the counter 17a reaches $n_2(>n_1)$, an "H" level output signal is generated from the second determining circuit 17c. Consequently, an "H" Level output signal is generated from the OR gate 17i. This "H" level output signal is applied to the reset terminal of the counter 17a through the AND gate 17j and the OR gate 17n, so that the counter 17a is reset. More specifically, when the "L" level output control signal is generated from the D-type flip-flop 12, a signal having a frequency of $f_1/n_2$ is generated at the output of the OR gate 17n as the output of the variable frequency divider 17.

Then, when the capturing operation of the PLL circuit is terminated, so that the phase is locked, an "H" level detection signal is applied to the input terminal 17g from the lock detecting circuit 16. Consequently, the AND gate 17m is opened while the AND gate 17j is closed. In this state, consider a case in which the "H" level output control signal is applied to one input of the AND gate 17k from the D-type flip-flop 12 through the input terminal 17f. In this case, when the counted value of the counter 17a reaches $n_3(n_1<n_3<n_2)$, an "H" level output is generated from the third determining circuit 17d, so that an "H" level signal is generated from the AND gate 17k. This "H" level output signal is applied to the reset terminal of the counter 17a through the OR gate 17l, the AND gate 17m and the OR gate 17n, so that the counter 17a is reset. More specifically, when the "H" level output control signal is generated from the D-type flip-flop 12, a signal having a frequency of $f_1/n_3$ is generated at the output of the OR gate 17n as an output of the variable frequency divider 17.

On the other hand, consider a case in which the "L" level output control signal is applied to one input of the AND gate 17k from the D-type flip-flop 12 through the input terminal 17f. In this case, an "H" level signal is not generated at the output of the AND gate 17k. When the counted value of the counter 17a reaches $n_4(n_3<n_4<n_2)$, an "H" level output signal is generated from the fourth determining circuit 17e, so that an "H" level output signal is generated from the OR gate 17l. This "H" level output signal is applied to the reset terminal of the counter 17a through the AND gate 17m and the OR gate 17n, so that the counter 17a is reset. More specifically, when the "L" level output control signal is generated from the D-type flip-flop 12, a signal having a frequency of $f_1/n_4$ is generated at the output of the OR gate 17n as an output of the variable frequency divider 17.

In a state in which the phase of the PLL circuit is locked, the phase of the input signal to the input terminal 9 coincides with the phase of the first output signal from the fixed frequency divider 8. Thus, in the above described second multiplier 13, when the above described input signal is synchronously detected, an output signal indicating that the input signal exists is generated at the output terminal 14. This output signal is detected by the lock detecting circuit 16. The lock detecting circuit 16 applies a detection signal to the input terminal 17g (in FIG. 7) of the variable frequency divider 17. As a result, the AND gate 17j is closed while the AND gate 17m is opened, which constitute the variable frequency divider 17, so that the switching range of the frequency dividing ratio of the variable frequency divider 17 is switched. More specifically, the variable frequency divider 17 frequency-divides a signal having a reference frequency with frequency dividing ratios $n_1$ and $n_2$ corresponding to the first and second determining circuits 17b and 17c in a non-locked state, while frequency-dividing the same with frequency dividing ratios $n_3$ and $n_4$ corresponding to the third and fourth determining circuits 17d and 17e in a locked state.

More specifically, the frequency dividing ratios $n_1$ and $n_2$ of the variable frequency divider 17 in the non-locked state and the frequency dividing ratios $n_3$ and $n_4$ of the variable frequency divider 17 in the locked state are set to the relation $n_1 < n_3 < n_4 < n_2$. Therefore, when the phase is not locked, the capture range is made wide so that the capture time of the PLL circuit can be shortened. In addition, when the phase is locked, the capture range is made narrow so that the stability of the PLL circuit can be enhanced.

Thus, in the second embodiment shown in FIGS. 6 and 7, the locked state is detected so that the switching range of the frequency dividing ratio of the variable frequency divider is changed. Thus, the capture speed can be improved and the stability of phase lock can be ensured.

Figure 8:
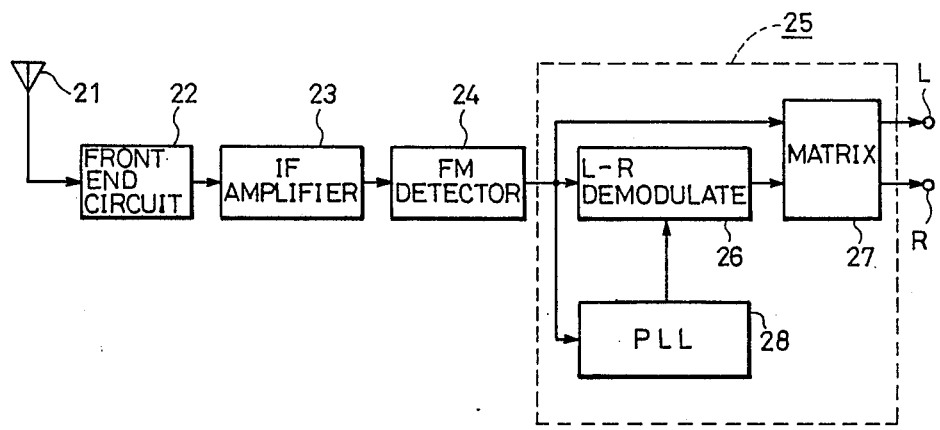
FIG. 8 is a block diagram showing one example of a stereo receiver to which the PLL circuit according to the embodiments of the present invention is applied.

FIG. 8 is a block diagram showing one example of a stereo receiver to which the PLL circuit according to the present invention as shown in FIG. 2 or 6 is applied.

In FIG. 8, an FM stereo signal received by an antenna 21 is applied to a front end circuit 22. This front end circuit 22 comprises an RF amplifier, a local oscillator and a mixer which are not shown. The received stereo signal is amplified in the RF amplifier and then, mixed with an output of the local oscillator in the mixer, to be converted into an intermediate frequency (IF) signal. This IF signal is amplified by an intermediate frequency amplifier 23 and then applied to an FM detector 24, to be FM-detected. A detection output of the FM detector 24 comprises an (L+R) signal, an (L−R) signal and a stereo pilot signal, which are applied to a stereo demodulator 25. The (L+R) signal in this FM detection output is directly applied to a matrix circuit 27 while the (L−R) signal therein is demodulated by an (L−R) demodulated 26. Since the (L−R) signal is modulated in a double sideband system, a carrier frequency signal of 38 KHz is required for demodulation of the (L−R) signal. The stereo pilot signal of 19 KHz in the output of the FM detector 24 is detected by a PLL circuit 28. The PLL circuit 28 generates in carrier frequency signal of 38 KHz which is synchronized with this stereo pilot signal, to apply the same to the (L−R) demodulator 26. The stereo receiver shown in FIG. 8 uses as this PLL circuit 28 the PLL circuit in the embodiment shown in FIG. 2 or 6. An (L−R) output of the (L−R) demodulator 26 is applied to the matrix circuit 27. The matrix circuit 27 separately outputs right and left signals L and R.

More specifically, although the structure itself of the stereo receiver shown in FIG. 8 is well-known, a stereo receiver using as the PLL circuit the PLL circuit shown in FIG. 2 or 6 is not known. Thus, in the stereo receiver shown in FIG. 8, formation as an IC is simple, and highly stable and high-precision phase lock operation, i.e, a stereo demodulating operation can be achieved.

Figure 9:
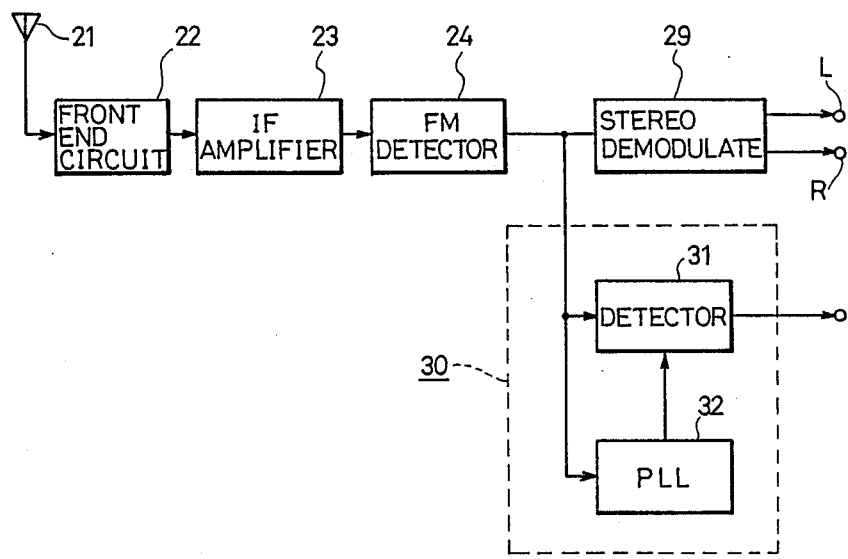
FIG. 9 is a block diagram showing another example of the stereo receiver to which the PLL circuit according to the embodiments of the present invention is applied.

Additionally, FIG. 9 is a block diagram showing an example in which the PLL circuit shown in FIG. 2 or 6 is applied to a system for detecting a signal added to a region higher in frequency than an (L−R) signal region of the received stereo signal. Such a system itself is known as a so-called ARI system. In this system, a given signal is always added to, for example, 57 KHz region which is higher in frequency than the (L−R) signal region of the received stereo signal. When this added signal is amplitude-modulated, the system demodulates the modulated signal, to detect the added signal such that information is obtained. More specifically, an output of an FM detector 24 is applied to an added signal detecting circuit 30, and further applied to a detector 31 for detecting the added signal as modulated of 57 KHz. A PLL circuit 32 detects the modulated signal of 57 KHz in the received stereo signal and generates a signal of 57 KHz, to apply the same to the detector 31. An output of the detector 31 is extracted as an added signal. This receiver shown in FIG. 9 uses as the PLL circuit 32 the PLL circuit in the embodiment shown in FIG. 2 or 6.

More specifically, although the structure of the stereo receiver shown in FIG. 9 is known, a stereo receiver using as the PLL circuit the PLL circuit shown in FIG. 2 or 6 is not known. Thus, in the stereo receiver shown in FIG. 9, formation as an IC is simple, and a highly stable and high-precision phase lock operation, i.e., detection of an added signal can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A PLL circuit comprising:
    means (9) receiving an input signal from the exterior,
    means (6) for generating a signal having a predetermined reference frequency,
    variable frequency divider means (7) for frequency-dividing said signal having the reference frequency with a variable frequency dividing ratio,
    fixed frequency divider means (8) for frequency-dividing an output of said variable frequency divider means to generate a first output signal and a second output signal which is out of phase by 90° from said first output signal,
    first multiplier means (10) for multiplying said input signal by said second output signal,
    comparator means (11) for comparing an output of said first multiplier means with a predetermined reference voltage, and
    a D-type flip-flop means (12) receiving as a D input an output of said comparator means and receiving as a clock input the first output signal from the fixed frequency divider means, the frequency dividing ratio of said variable frequency divider means being changed depending on an output of the D-type flip-flop means.

2. The PLL circuit according to claim 1, which further comprises second multiplier means (13) for multiplying said input signal by said first output signal.

3. The PLL circuit according to claim 1, wherein said variable frequency divider means comprises
counter means (7a) for counting said signal having the reference frequency,
first determining means (7b) for determining that the counted value of said counter means becomes a first value,
second determining means (7c) for determining that the counted value of said counter means becomes a second value larger than said first value,
means (7d, 7e) for resetting said counter means by an output of said second determining means and supplying the output of said second determining means as the output of said variable frequency divider means when the output of said D-type flip-flop means indicates that said second output signal leads said input signal by 90° or more while resetting said counter means by an output of said first determining means and supplying the output of said first determining means as the output of said variable frequency divider means when the output of said D-type flip-flop means indicates that said second output signal lags said input signal by 90° or more.

4. The PLL circuit according to claim 2, which further comprises means (16) receiving an output of said second multiplier means for detecting synchronization of said input signal with said first output signal,
said variable frequency divider means being responsive to an output of said synchronization detecting means for changing said frequency dividing ratio in a first range when said input signal is not synchronized with said first output signal while changing the frequency dividing ratio in a second range narrower than said first range when said input signal is synchronized with said first output signal.

5. The PLL circuit according to claim 4, wherein said variable frequency divider means comprises
counter means (17a) for counting said signal having the reference frequency,
first determining means (17b) for determining that the counted value of said counter means becomes a first value,
second determining means (17c) for determining that the counted value of said counter means becomes a second value,
third determining means (17d) for determining that the counted value of said counter means becomes a third value,
fourth determining means (17e) for determining that the counted value of said counter means becomes a fourth value,
said first to fourth values being increased in the order of the first value, the third value, the fourth value and the second value,
first supplying means (17h, 17i) for resetting said counter means by an output of said second determining means and supplying the output of said second determining means as the output of said variable frequency divider means when the output of said D-type flip-flop means indicates that said second output signal leads said input signal by 90° or more while resetting said counter means by an output of said first determining means and supplying the output of said first determining means as the output of said variable frequency divider means when the output of D-type flip-flop means indicates that said second output signal lags said input signal by 90° or more,
second supplying means (17k, 17l) for resetting said counter means by an output of said fourth determining means and supplying the output of said fourth determining means as the output of said variable frequency divider means when the output of said D-type flip-flop means indicates that said second output signal leads said input signal by 90° or more while resetting said counter means by an output of said third determining means and supplying the output of said third determining means as the output of said variable frequency divider means when the output of said D-type flip-flop means indicates that said second output signal lags said input signal by 90° or more, and
means (17j, 17m, 17n) for selecting an output of said first supplying means when said synchronization detecting means detects the fact that said input signal is not synchronized with said first output signal while selecting an output of said second supplying means when said synchronization detecting means detects the fact that said input signal is synchronized with said first output signal.

6. The PLL circuit according in claim 1, wherein said first multiplier comprises a double balanced type multiplier.

7. A stereo receiver comprising:
means (21, 22, 23) for receiving a stereo signal,
means (24) for detecting said received stereo signal,
means (25, 29) for stereo demodulating said detected stereo signal,
PLL means (28, 32) for detecting a particular signal in said detected stereo signal, to generate a signal synchronized with the detected signal,
said PLL means comprising
means (9) for receiving a particular input signal from said detector means,
means (6) for generating a signal having a predetermined reference frequency,
variable frequency divider means (7) for frequency-dividing said signal having the reference frequency with a variable frequency dividing ratio,
fixed frequency divider means (8) for frequency-dividing an output of said variable frequency divider means, to generate a first output signal and a second output signal which is out of phase by 90° from said first output signal,
first multiplier means (10) for multiplying said input signal by said second output signal,
comparator means (11) for comparing an output of said first multiplier means with a predetermined reference voltage, and
D-type flip-flop means (12) receiving as a D input an output of said comparator means and receiving as a clock input the first output signal from said fixed frequency divider means,
the frequency dividing ratio of said variable frequency divider means being changed depending on an output of said D-type flip-flop means.

8. The stereo receiver according to claim 7, wherein said PLL means further comprises second multiplier means (13) for multiplying said input signal by said first output signal.

9. The stereo receiver according to claim 8, wherein said PLL means further comprises means (16) receiving an output of said second multiplier means for detecting synchronization of said input signal with said first output signal, said variable frequency divider means being responsive to an output of said synchronization detecting means for changing the frequency dividing ratio in a first range when said input signal is not synchronized with said output signal while changing the frequency dividing ratio in a second range narrower than said first range when said input signal is synchronized with said first output signal.

* * * * *